United States Patent
Nakatsuka et al.

(10) Patent No.: US 7,206,329 B2
(45) Date of Patent: Apr. 17, 2007

(54) DRIVING SYSTEM FOR A SEMICONDUCTOR LASER DEVICE

(75) Inventors: Shinichi Nakatsuka, Hino (JP); Jyunshin Sakamoto, Mito (JP); Hiroshi Inenaga, Hitachi (JP); Susumu Saito, Hachioji (JP)

(73) Assignee: Ricoh Printing Systems Co., Ltd., Tokyo (JP)

(*) Notice: Subject to any disclaimer, the term of this patent is extended or adjusted under 35 U.S.C. 154(b) by 332 days.

(21) Appl. No.: 10/871,280

(22) Filed: Jun. 21, 2004

(65) Prior Publication Data

US 2005/0169329 A1 Aug. 4, 2005

(30) Foreign Application Priority Data

Jan. 30, 2004 (JP) ............................. 2004-022736

(51) Int. Cl.
*H01S 3/00* (2006.01)
(52) U.S. Cl. ................................. 372/38.02; 372/38.07
(58) Field of Classification Search .............. 372/38.1, 372/38.01, 38.02, 38.07, 33; 257/107, 112
See application file for complete search history.

(56) References Cited

U.S. PATENT DOCUMENTS

| | | | | | |
|---|---|---|---|---|---|
| 3,806,762 | A | * | 4/1974 | Punis et al. ................. | 315/307 |
| 4,484,331 | A | * | 11/1984 | Miller ........................ | 372/34 |
| 5,666,367 | A | * | 9/1997 | Troyanovsky ............... | 714/724 |
| 6,807,202 | B1 | * | 10/2004 | Plamper et al. ............ | 372/29.02 |

FOREIGN PATENT DOCUMENTS

| | | |
|---|---|---|
| JP | 5-13850 | 1/1991 |
| JP | 5-129899 | 11/1991 |
| JP | 7-297448 | 4/1994 |

OTHER PUBLICATIONS

"Photothyristor" Zhao et al.; Whiley Encyclopedia of Electrical and Electronics Engineering; 1999; at (http://www.mrw.interscience.wiley.com/eeee/articles/W6032/sect0-fs.html) obtained on Jul. 6, 2006.*
R.S. Geels et al., "Dual Spot Visible Laser Diodes", Electronics Letters Jul. 16, 1992, vol. 28, No. 15, pp. 1460-1462.

* cited by examiner

*Primary Examiner*—Armando Rodriguez
(74) *Attorney, Agent, or Firm*—Reed Smith LLP; Stanley P. Fisher, Esq.; Juan Carlos A. Marquez, Esq.

(57) ABSTRACT

When a semiconductor laser is energized, a virtual junction temperature rises to reduce a threshold current, which fluctuates a light output by the unit of a several microseconds, thereby causing printing irregularity. An object of the invention is to prevent the fluctuation in light output occurring due to the temperature change caused by the energization of the semiconductor laser with a simple circuit structure and under the driving condition of a small bias current. A constant voltage driving is performed with a circuit or device having negative resistance characteristics being arranged in series with the semiconductor laser. Thus, the reduction in light output of the semiconductor laser due to the temperature rise is compensated for by an increase in driving current thanks to a reduction in rising voltage of current/voltage characteristics.

5 Claims, 10 Drawing Sheets

DRIVING SYSTEM FOR A SEMICONDUCTOR LASER DEVICE

CLAIM OF PRIORITY

The present application claims priority from Japanese Patent Application No. 2004-022736 filed on Jan. 30, 2004, the content of which is hereby incorporated by reference into this application.

BACKGROUND OF THE INVENTION

1. Field of the Invention

The present invention relates to a driving system for a semiconductor light emitting device. In particular, the present invention relates to improvements in performance of a laser exposing system to be used in a laser printer for printing images using distribution of static electric potentials formed by exposing laser beams emitted from a semiconductor laser as well as improvements in high quality images produced by the laser printer using the laser exposing system.

2. Description of the Related Art

Figure 1:
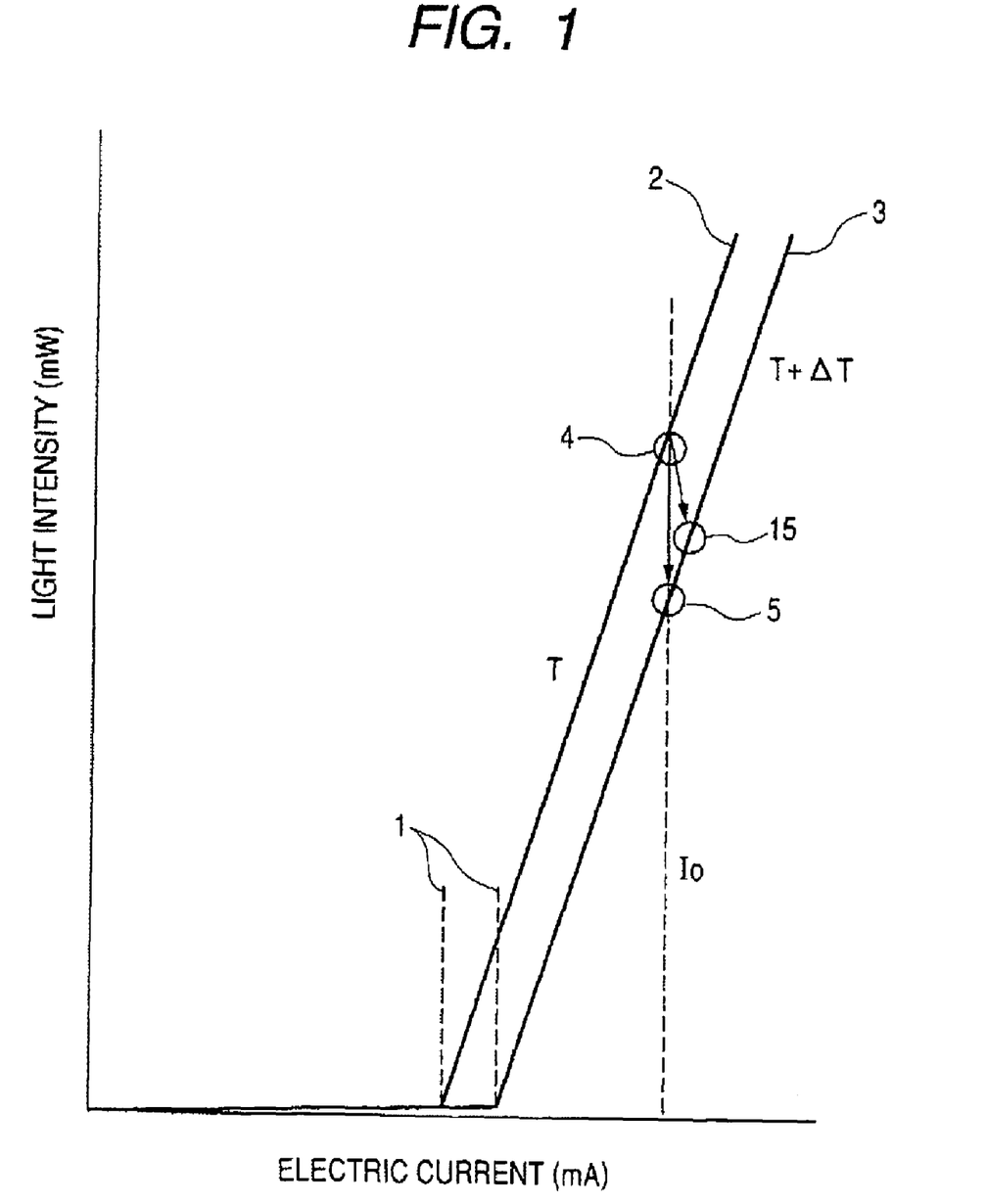
FIG. 1 is a conceptual diagram showing light output/current characteristics of a semiconductor laser.
Figure 2:
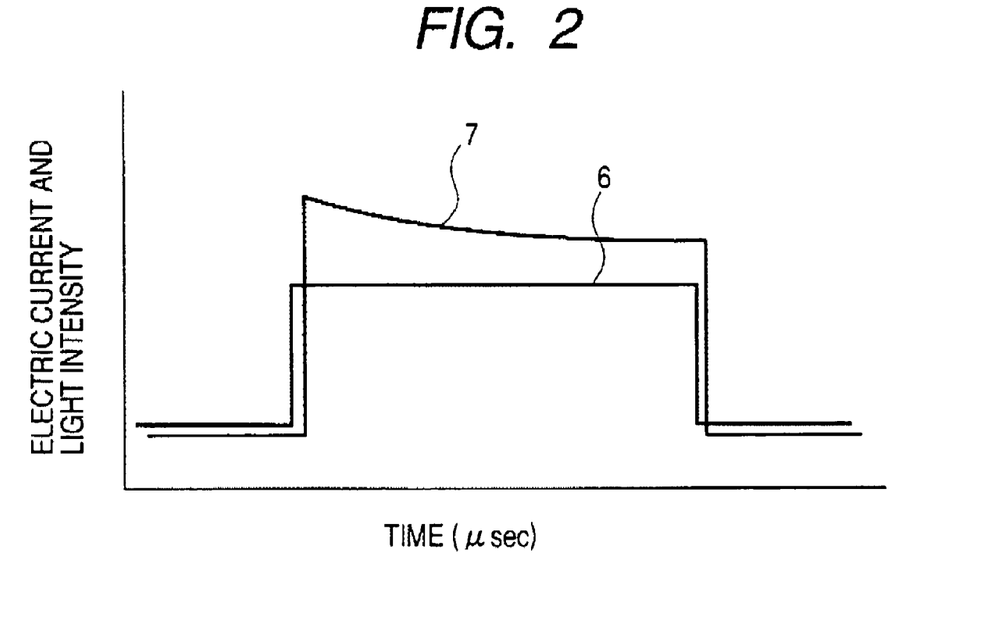
FIG. 2 is a conceptual diagram showing droop characteristics of the semiconductor laser.

Laser printers perform printing in the following manner: Pulsed laser beams are generated according to a pattern of an image to be printed; a charged photoconductive film is scanned with the laser beams for forming a static electricity image; the static electricity image controls toner adhesion thereto for forming the pattern to be printed: and the pattern is transferred on a surface of a printing stock. In the case of driving the semiconductor laser serving as a light source by the use of a pulsed current, a virtual junction temperature of the semiconductor laser rises with a time constant of a several microseconds to a several tens of microseconds after the application of current to the semiconductor laser. Generally, light output/current characteristics of the semiconductor laser are such that a threshold current 1 of laser oscillation is increased with the rise in virtual junction temperature. A conceptual diagram of the light output/current characteristics (2, 3) in the case where the virtual junction temperature changes from T to (T+ΔT) is shown in FIG. 1. A constant current source is usually used for driving the semiconductor laser because of its easy light intensity control; however, in the case of supplying a current of $I_0$ using the constant current source, the light output of the semiconductor laser is reduced from the initial output 4 to the output with the raised temperature 5 due to the change in light output/current characteristics. Accordingly, waveforms (6, 7) of an electric current and an optical pulse when the constant pulsed current is applied are as shown in FIG. 2, and the light intensity changes with time although the electric current value is kept constant.

Figure 3:
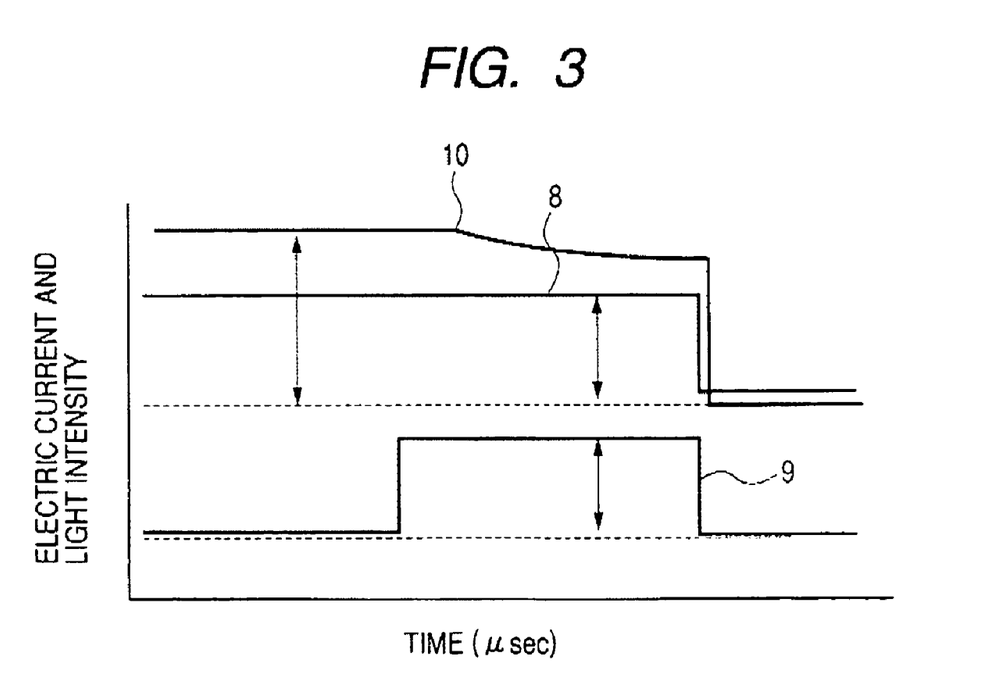
FIG. 3 is a conceptual diagram showing thermal crosstalk of the semiconductor laser.

Such phenomenon is the so-called droop phenomenon, which causes occurrence of irregularity of a printed image. Further, an associated phenomenon is a thermal crosstalk, which is problematic in a laser array having a plurality of light emitting devices on one and the same chip. The thermal crosstalk is caused by the reduction in light output due to the virtual junction temperature rise like the droop phenomenon; however, the phenomenon is different from the droop phenomenon in that the virtual junction temperature rises not because of the conduction of the device emitting light but because of a conduction of an adjacent device. That is to say even when a driving current 8 for the device emitting light does not change, a temperature of the device rises due to heating caused by a fluctuation in driving current of the adjacent device to reduce a light output 10 of the device emitting light, resulting in generation of irregularity of the printed image.

Figure 4:
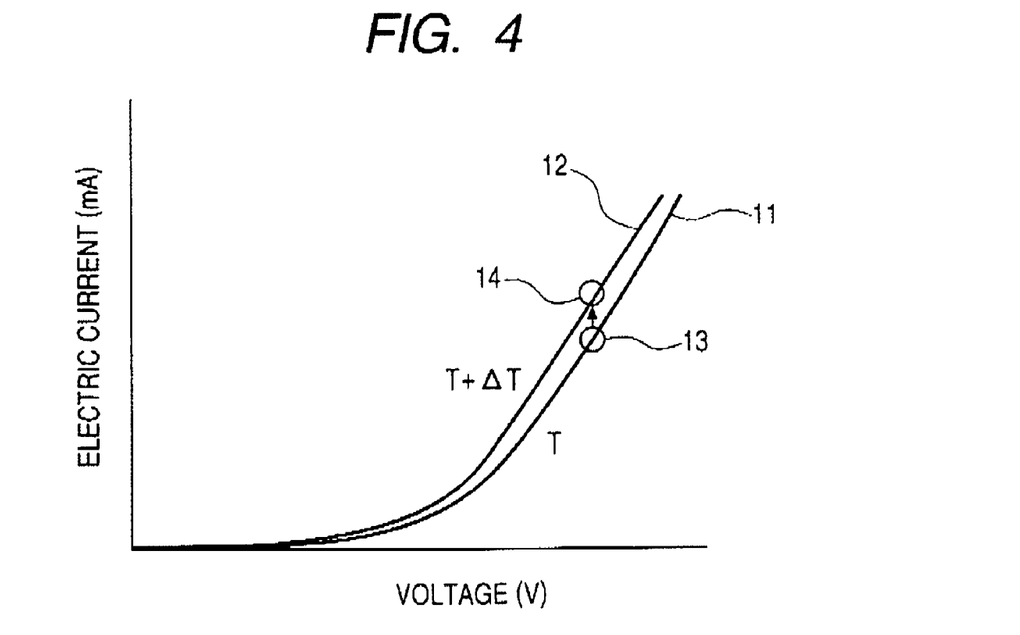
FIG. 4 is a conceptual diagram showing current/voltage characteristics of the semiconductor laser.

Electronics Letters; Vol. 28; P. 1460; 1991 describes the following: in the constant voltage driving wherein the driving source supplies pulses of a constant voltage to cause the semiconductor laser to emit light, the driving current is increased because a rising voltage of the current/voltage characteristics of the semiconductor laser is reduced when the virtual junction temperature rises. This compensates for the reduction in light output to mitigate the droop phenomenon. That is to say, owing to the difference between the voltage/current characteristics (11, 12) due to the virtual junction temperature shown in FIG. 4, the current flowing through the semiconductor laser at the time of application of the constant voltage is increased from the initial current value 13 to the current value after temperature rise 14 to compensate for the reduction in light output.

Owing to a series resistance of the semiconductor laser, the current increment is not sufficient, and the effect of stabilizing the light output achieved by the above method is so limitative that the light output moves to the point 15 of FIG. 1. Therefore, it has been necessary to employ this method in combination with another droop reduction method such as biasing with a threshold electric current at the time of non-energization.

Japanese Patent Laid-open No. 5-129899 discloses a negative resistance circuit proposed for the realization of a bistable circuit. The object of the negative resistance circuit is different from that of the present invention which aims to achieve a stable driving of semiconductor lasers. In addition, the method of forming the negative resistance circuit is similar to that of a circuit described in embodiments of this invention.

Japanese Patent Laid-open No. 7-297448 discloses a negative resistance device arranged in series with a light emitting device so as to control on/off of the light emitting device. In spite of the structure of the serial provision of the negative resistance device and the light emitting device, the object thereof is bistability, and the structure does not have a function of compensating for a fluctuation in output light at a stable point, which is described in the present specification.

According to Japanese Patent Laid-open No. 05-13850, a bias current is changed depending on a change in threshold current caused by a temperature fluctuation in a driving circuit of an optical communication semiconductor laser, whereby the bias current whose value is substantially the same as that of the threshold current is continuously applied. Since a temperature change in gate voltage of an FET is used for controlling the bias current, it is possible to arrange the structure so as to equalize a change in bias current with a value corresponding to the temperature change in threshold current. The temperature change in this document corresponds to a change in ambient temperature common to both the FET and the semiconductor laser; however, the it does not cope with the fluctuation due to the virtual junction temperature change in laser output which is more local and rapid in response speed unlike the present invention which takes advantage of the temperature change in voltage of the semiconductor laser itself.

Electronics Letters: Vol. 28; P. 1460; 1991 describes the following; When a semiconductor laser for a laser printer is driven for light emission by a constant voltage circuit for generating a constant pulsed voltage, a current flowing through the semiconductor laser is increased with an increase in virtual junction temperature to compensate for a reduction in light output due to the virtual junction temperature rise, thereby reducing fluctuation in light output due to the temperature fluctuation.

The present invention provides a simple circuit structure capable of preventing a light output fluctuation which is otherwise caused by a temperature change due to energization of a semiconductor laser under the driving condition of small bias current.

SUMMARY OF THE INVENTION

In order to solve the above described problems in the conventional technologies, the present invention provides a function of maintaining a voltage to be applied to a predetermined portion of a driving circuit of a semiconductor laser at a constant value, wherein the predetermined portion of the circuit includes the semiconductor laser and a negative resistance circuit or a negative resistance device arranged in series with the semiconductor laser. In addition, a differential resistance of the predetermined portion of the circuit is set to a value that enables to equalize an increase in oscillation threshold current of the semiconductor laser caused by a temperature change with an increase in a driving current of the semiconductor laser caused by the temperature change. A proper value of the differential resistance is given by the following equation.

$$\Delta I = \frac{d\, I_{0\exp}\left(\frac{T-To}{Tc}\right)}{dT}\Delta T = \frac{I_{0\exp}\left(\frac{T-To}{Tc}\right)}{Tc}\Delta T \quad (1)$$

Where Tc represents a characteristic temperature of the semiconductor laser; To represents a reference temperature (room temperature); and Io represents a threshold current at the reference temperature. A change in current value obtained by a change in rising voltage of current/voltage characteristics of the semiconductor laser due to a temperature change $\Delta$ is given by the following equation.

$$\Delta I = -\frac{dV}{dT}\frac{1}{Rs}\Delta T \quad (2)$$

The equations (1) and (2) show that the following equation should be satisfied in order to compensate for a reduction in light output of the semiconductor laser due to the temperature rise by increasing the driving current in accordance with a change in current/voltage characteristics at the time of constant voltage operation.

$$-\frac{dV}{dT}\frac{1}{Rs} = \frac{I_{0\exp}\left(\frac{T-To}{Tc}\right)}{Tc} \quad (3)$$

Taking an example from an AlGaInP semiconductor laser (wavelength: 630 nm) having a cavity of 300 µm and a stripe width of 5 µm, parameters required for calculating the optimum Rs from the equation (3) are values shown in a column of ALGaInP of Table 1, and the equation (3) is satisfied when a series resistance of the semiconductor laser is 2 Ω. However, a series resistance of an actual semiconductor laser is about 10 Ω, which is larger than the satisfactory value. It is possible that the series resistance cannot be reduced to 2 Ω since the value is substantially a lower limit of materials used for forming the semiconductor laser.

TABLE 1

|  | AlGaInP (λ630 nm) | AlGaInAs (λ780 nm) | AlGaN (λ405 nm) |
|---|---|---|---|
| dV/dT | 6.0e$^{-4}$ | 3.8e$^{-4}$ | 3.8e$^{-4}$ |
| Tc | 80 K | 140 K | 200 K |
| Io | 24 mA | 12 mA | 50 mA |

In this invention, in order to break through the limit of the conventional technologies, it is proposed to provide a circuit or a device having a negative differential resistance arranged in series with the semiconductor laser. As a result of subtracting a negative partial resistance from a series resistance of the semiconductor laser, a differential resistance of a predetermined portion of a driving circuit including the semiconductor laser becomes equal to a series resistance required for stabilizing the light output with respect to the fluctuation in virtual junction temperature by the constant voltage driving. Thus, it is possible to compensate for the thermal fluctuation of the semiconductor laser.

According to the invention, it is possible to perfectly compensate for the fluctuation in light output of the semiconductor laser caused by the fluctuation in virtual junction temperature. In addition, it is possible to reduce the number of components and production cost of an optical exposure system as a whole because it is unnecessary to monitor the light output of the semiconductor laser to dynamically feedback the light output to the driving circuit.

DESCRIPTION OF THE PREFERRED EMBODIMENTS

Embodiment 1

Figure 5:
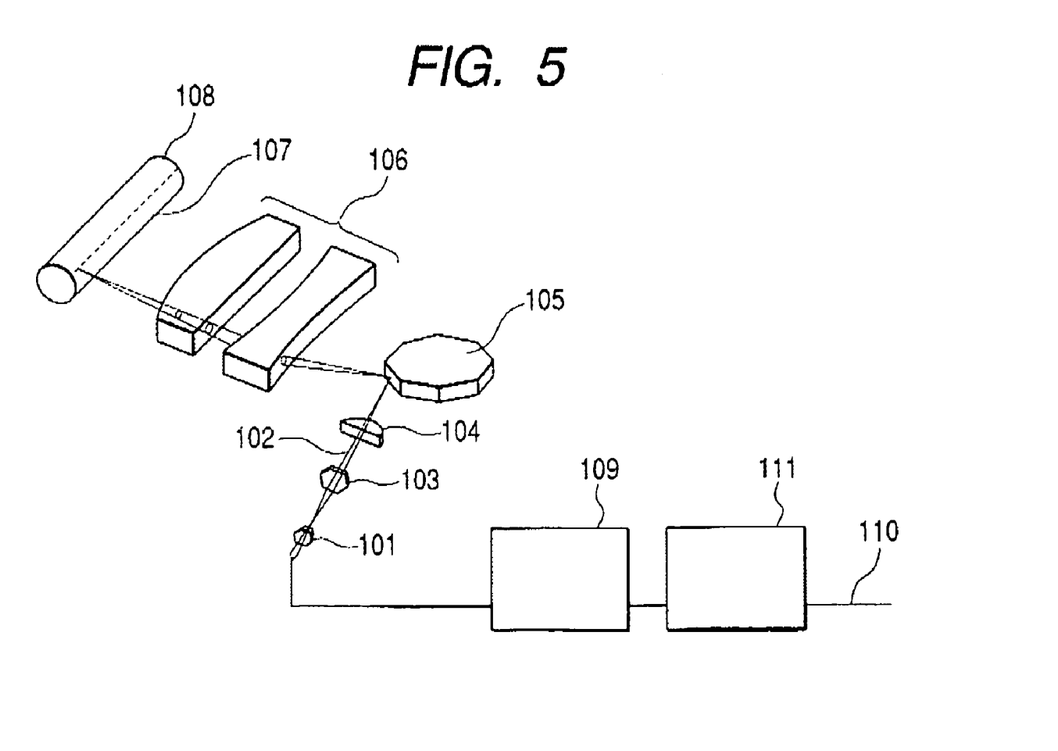
FIG. 5 is a block diagram showing a laser printer.

Hereinafter, a first embodiment of the present invention will be described with reference to the drawings. Shown in FIG. 5 is an exposure optical system of a laser printer to which the invention is applied. Laser beams 102 emitted from a semiconductor laser 101 are collimated by the use of a collimator lens 103, and then the collimated beams are condensed on a rotating polygonal mirror 105 by the use of a condenser lens 104. The laser beams 102 reflected by the polygonal mirror 105 are condensed by a non-spherical lens 106 so that the laser beams 102 may scan at a constant speed a drum 108 on which a photoconductive material 107 is applied. The semiconductor laser 101 is driven by a laser driving unit 109. An output from the laser driving unit 109 is controlled by a signal from a signal processing unit 111 which converts externally input image information 110 into laser switching information.

Figure 6:
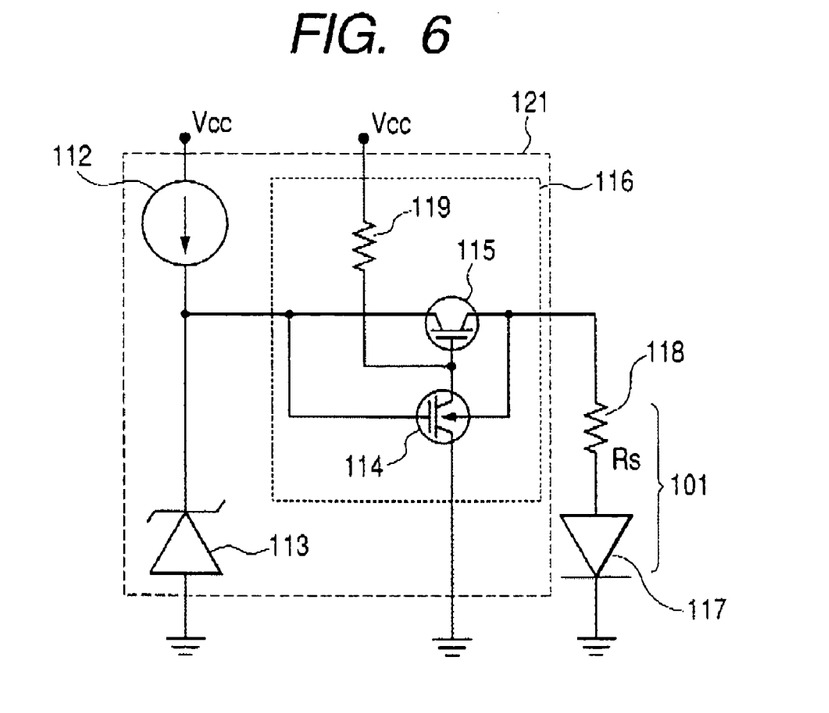
FIG. 6 is a diagram showing a laser driving unit of a first embodiment of the present invention.

A structure of the laser driving unit 109 is shown in FIG. 6. This unit includes a constant current circuit, a Zener diode 113, a negative resistance circuit 116 having two transistors (114, 115), and a semiconductor laser 101. The constant current circuit provides a constant current in response to the signal from the signal processing unit to a circuit using power supplied from 12 V power source. The Zener diode 113 maintains an input signal from a constant current source 112 at a predetermined voltage. The semiconductor laser is illustrated as two elements of an ideal diode 117 and a series resistance 118 in FIG. 6.

The Zener diode 113 operates to maintain a voltage at an input terminal of the negative resistance circuit 116 at 4.5 V when the signal is on. A source terminal of the first transistor of the negative resistance circuit is connected to the 12 V power source via a control resistor 119. When a potential difference between the terminals of the negative resistance circuit, a current supplied to the first transistor 114 is increased, and a gate voltage of the second transistor 115 is decreased due to a voltage drop of the control resistor 119, whereby a current flowing through the second transistor is reduced. As a result, a negative resistance with which the passing current is reduced due to the increase in potential difference between the terminals is realized in the negative resistance circuit.

The semiconductor laser 101 used in this embodiment is a 630 nm AlGaInP strained quantum well laser having a cavity of 300 μm, a stripe width of 5 μm, a threshold current of 24 mA, a characteristic temperature of 80 K, and a series resistance of 10 Ω. A differential resistance Rn of the negative resistance circuit is represented by using resistance Rc of the control resistor and respective transmission admittances $Y_{tr1}$ and $Y_{tr2}$ of the first and the second transistor as follows:

$$Rn = -\frac{1}{Rc \cdot Y_{tr1} \cdot Y_{tr2}} \quad (4)$$

In this embodiment, Rc, $Y_{tr1}$, and $Y_{tr2}$ are set to 125 Ω, 0.01 S, and 0.1 S, respectively, so that the Rn becomes −8 Ω.

Figure 16:
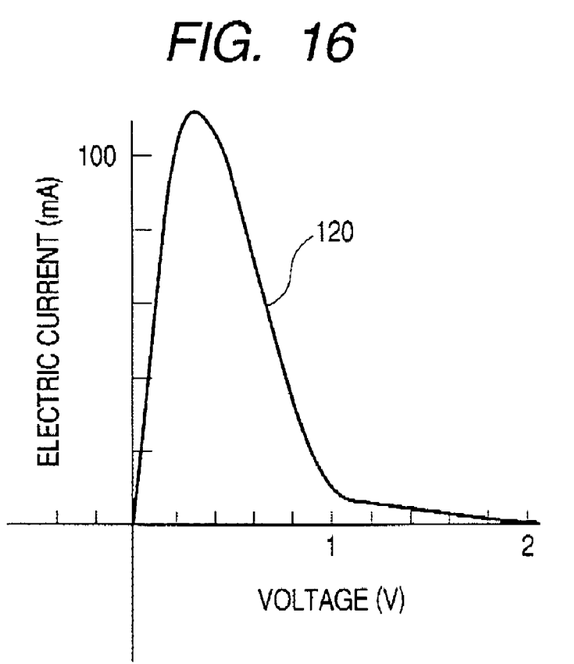
FIG. 16 is a diagram showing input output characteristics of a negative resistance circuit according to the invention.
Figure 17:
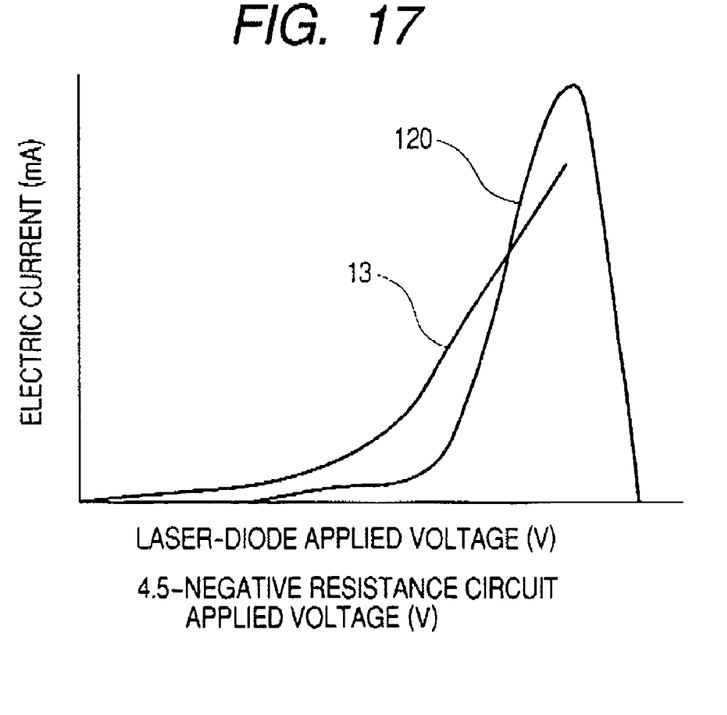
FIG. 17 is a diagram showing input output characteristics of a light emitting device and output characteristics obtained by applying 4.5 V (negative resistance circuit applied voltage) to the negative resistance circuit.

Current/voltage characteristics of the negative resistance circuit are shown in FIG. 16. A current flowing through the circuit in which the semiconductor laser is connected to the negative resistance circuit in series is obtained from an intersection of curves as shown in FIG. 17 where the curve obtained by transforming the horizontal axis into 4.5-negative resistance circuit applied voltage is overlaid on the curve of current/voltage characteristics 13 of the semiconductor laser. This is because the applied voltage of the semiconductor laser should agree with a value obtained by subtracting the voltage drop caused by the negative resistance circuit from the voltage maintained by the Zener diode. Thus, the differential resistance of the circuit from the Zener diode terminal is 2 Ω, which is equal to a difference between differential resistances of the semiconductor laser and the negative resistance circuit, thereby satisfying the droop suppressing conditions.

Embodiment 2

Figure 7:
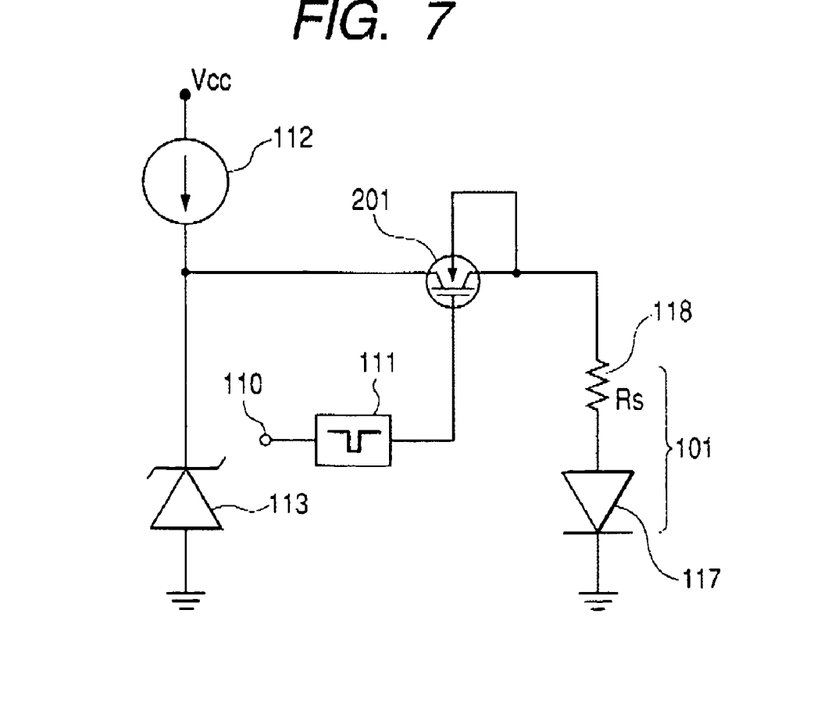
FIG. 7 is a diagram showing a laser driving unit of a second embodiment of the invention.

Hereinafter, a second embodiment will be described with reference to the drawings. An exposure optical system of a laser printer to which the invention is applied is similar to that of the first embodiment except for using a simple circuit as shown in FIG. 7 as the laser driving unit. This unit includes a constant current circuit for providing a constant current to the circuit using power supplied from 12 V power source, a Zener diode 113 for maintaining an input signal from a constant current source 112 at a predetermined voltage, a field effect transistor 201 for controlling a current in accordance with a signal from a signal processing unit 111, and a semiconductor laser 101. The semiconductor laser is illustrated as two elements of an ideal diode 117 and a series resistor 118 in FIG. 7.

The Zener diode 113 operates to maintain a voltage at an input terminal of the field effect transistor 201 at 4.5 V when the signal is on. The field effect transistor 201 is of normal open type. When the semiconductor laser is turned on, a signal processing unit applies a gate voltage of 4.5 V, whereas when the semiconductor laser is turned off, the signal processing unit applies a gate voltage of 12 V. A drain-gate voltage is increased with a reduction in drain voltage of the field effect transistor 201, so that a current amount of the field effect transistor 201 is reduced. As a result, the field effect transistor 201 performs a negative resistance operation by which the current is reduced with an increase in applied voltage.

The semiconductor laser 101 used in this embodiment is a 630 nm AlGaInP strained quantum well laser having a cavity of 300 μm, a stripe width of 5 μm, a threshold current of 24 mA, a characteristic temperature of 80 K, and a series resistor of 10 Ω. A differential resistance Rn of the field effect transistor 201 is represented as below using transmission admittance $Y_{tr}$ of the field effect transistor 201.

$$Rn = \frac{1}{Y_{tr}} \quad (5)$$

In this embodiment, $Y_{tr}$ is set to −0.125 S and Rn is set to −8 Ω to maintain a differential resistance of a load including the semiconductor laser at 2 Ω.

Embodiment 3

Figure 8:
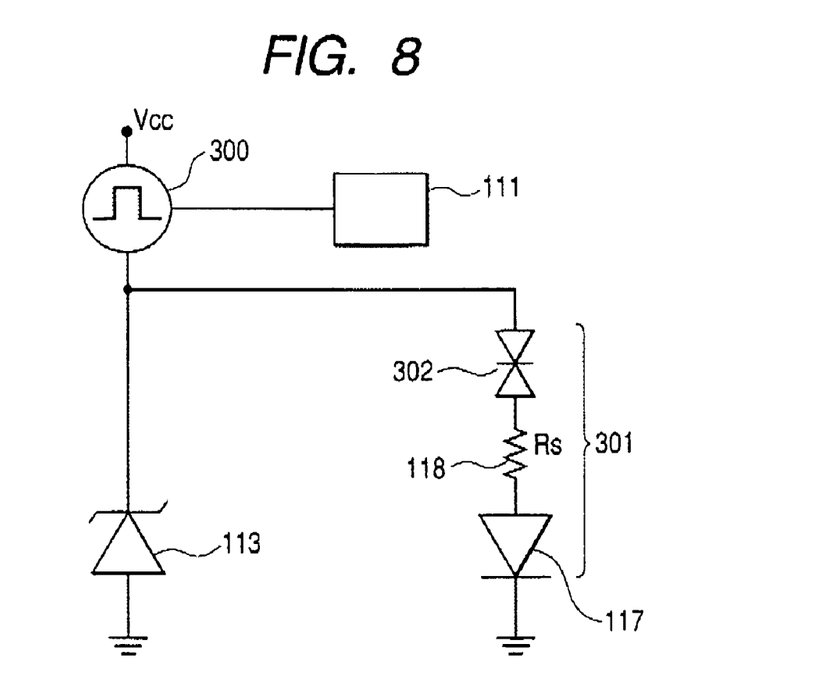
FIG. 8 is a diagram showing a laser driving unit of a third embodiment of the invention.

Hereinafter, a third embodiment of the invention will be described with reference to the drawings. An exposure optical system of a laser printer to which the invention is applied is similar to that of the first embodiment except for using a simple circuit shown in FIG. 8 as the laser driving unit, This unit includes a constant current pulsed source 300, a Zener diode 113, and a semiconductor laser 301. The constant current pulsed source 300 provides a constant current that is responsive to a signal from a signal processing unit 111 to the circuit using power supplied from 12 V power source. The Zener diode 113 maintains an input signal from the constant current pulsed source 300 at a predetermined voltage. The semiconductor laser is illustrated as three elements of an ideal diode 117, a series resistor 118, and a tunnel diode 302 having a negative resistance in FIG. 8. The Zener diode 113 operates to maintain a voltage at an input terminal of the semiconductor laser 301 at 4.5 V when the signal is on.

Figure 9:
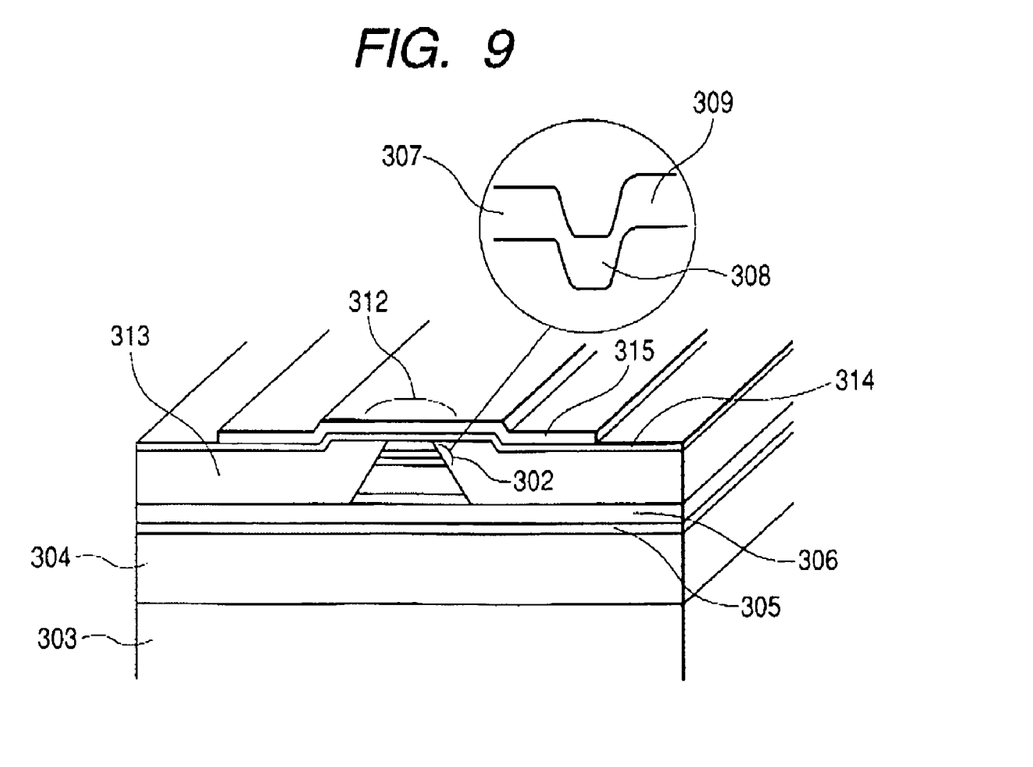
FIG. 9 is a diagram showing a structure of a semiconductor laser of the third embodiment of the invention.
Figure 10:
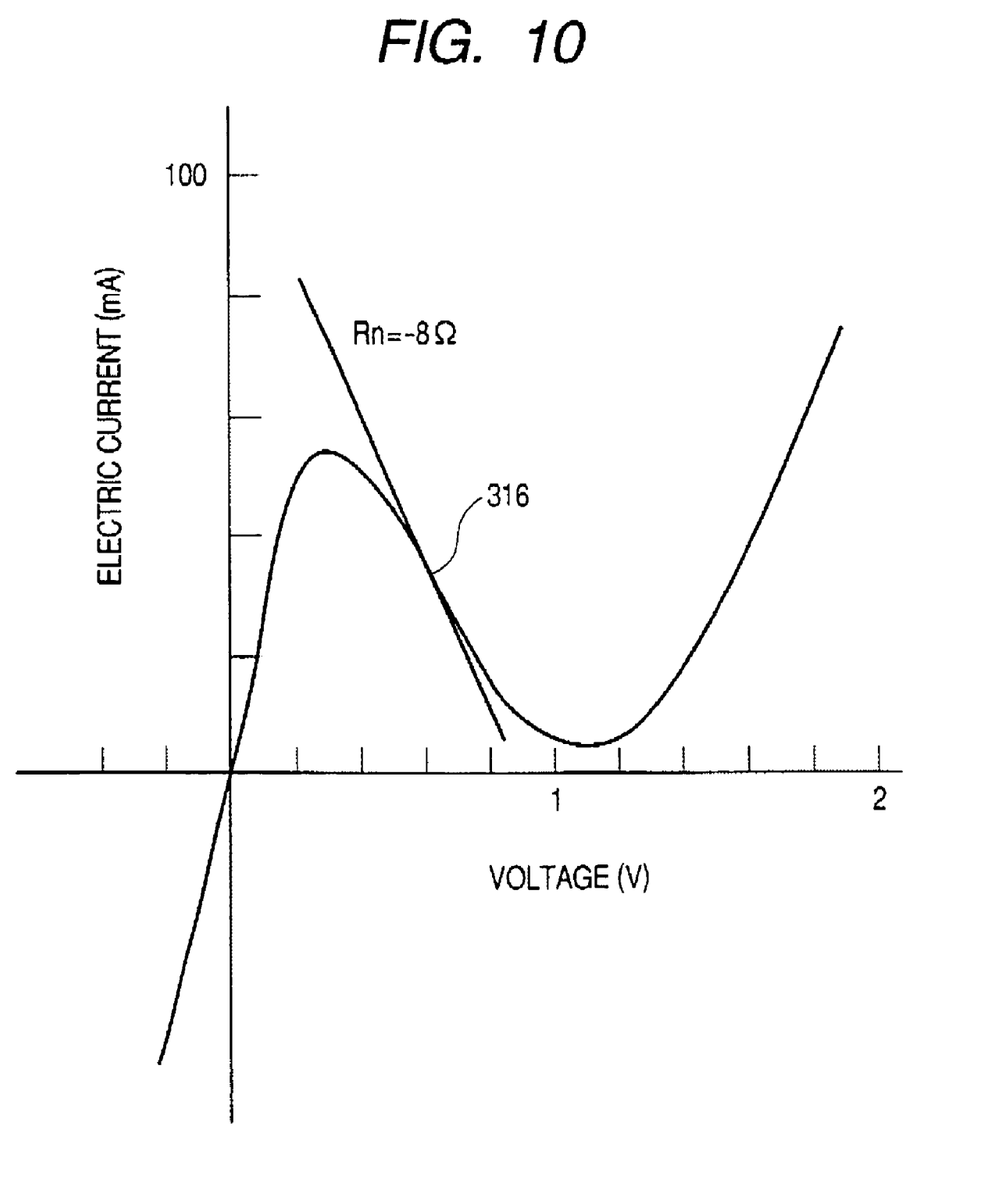
FIG. 10 is a diagram showing current/voltage characteristics of a tunnel diode of the semiconductor laser according to the third embodiment of the invention.

The semiconductor laser 301 of this embodiment is configured as shown in a cross-sectional view of FIG. 9. More specifically, an n-type clad layer 304 (Se doped, p=7×10^{17} cm^{−3}, 1.8 μm) made of $(Al_{0.7}Ga_{0.3})_{0.5}In_{0.5}P$, a multi quantum well active layer 305, a p-type clad layer 306 (Zn doped, n=1×10^{18} cm^{−3}, 1.8 μm) made of $(Al_{0.7}Ga_{0.3})_{0.5}In_{0.5}P$, a p-type GaAs layer 307 (Zn doped, n=1×10^{20} cm^{−3}, 200 nm), an-n type GaAs layer 308 (Si doped, n=1×10^{20} cm^{−3}, 200 nm), and a p-type GaAs layer 309 (Zn doped, n=3×10^{19} cm^{−3}, 20 nm) are sequentially formed on an n-type GaAs substrate 303. The multi quantum well active layer is composed of three $Ga_{0.5}In_{0.5}P$ well layers 310 (thickness: 7 nm) and four $(Al_{0.5}Ga_{0.5})_{0.5}In_{0.5}P$ barrier layer 311 (thickness: 4 nm) alternately sandwiching the $Ga_{0.5}In_{0.5}P$ well layers 310 therebetween. Prom the p type GaAs layer 309 to the p type clad layer 306 made of $(Al_{0.7}Ga_{0.3})_{0.5}In_{0.5}P$ are chemically removed so that the thickness thereof may be reduced to about 0.3 μm except for a stripe region 312 having a stripe width of 4 μm, and an n-GaAs current block layer 313 is formed thereon. Further, a p-GaAs layer 314 is formed on the N-GaAs current block layer 313 in order to reduce a contact resistance with a gold electrode 315 which is formed on the p-GaAs contact layer 314. The p-type GaAs layer 307, the n-type GaAs layer 308, and the p-type GaAs layer 309 constitute a tunnel diode 302 of which current/voltage characteristics are as shown in FIG. 10. Operation of the tunnel diode is as described below. A large tunnel current flows through a junction of the p-type GaAs layer 307 with the n-type GaAs layer 308 because both of the layers are doped with impurity at a concentration of as high as 1×10^{20} cm^{−3}, and a voltage drop scarcely occurs at the junction. Since an impurity concentration of the p-type GaAs layer 309 is as relatively low as 3×10^{19} cm^{−3}, a junction of the n-type GaAs layer 308 with the p-type GaAs layer 309 does not help to constitute a perfect tunnel diode. Instead, an Esaki diode is constituted, that is, a tunnel current flows through the junction in a low voltage region, but the tunnel current is reduced with an increase in voltage resulting in a temporary reduction, and a further increased voltage allows the an ordinary diode current to flow. As shown in FIG. 10, a negative resistance region 316 having a differential resistance of about −8 Ω appears in the current/voltage characteristics of the tunnel diode. The negative resistance characteristics of the region makes it possible to set a differential resistance of the device as a whole to 2 Ω. It is thus possible to reduce a temperature fluctuation in light output by driving the device of this embodiment by way of the constant voltage driving.

Embodiment 4

Figure 11:
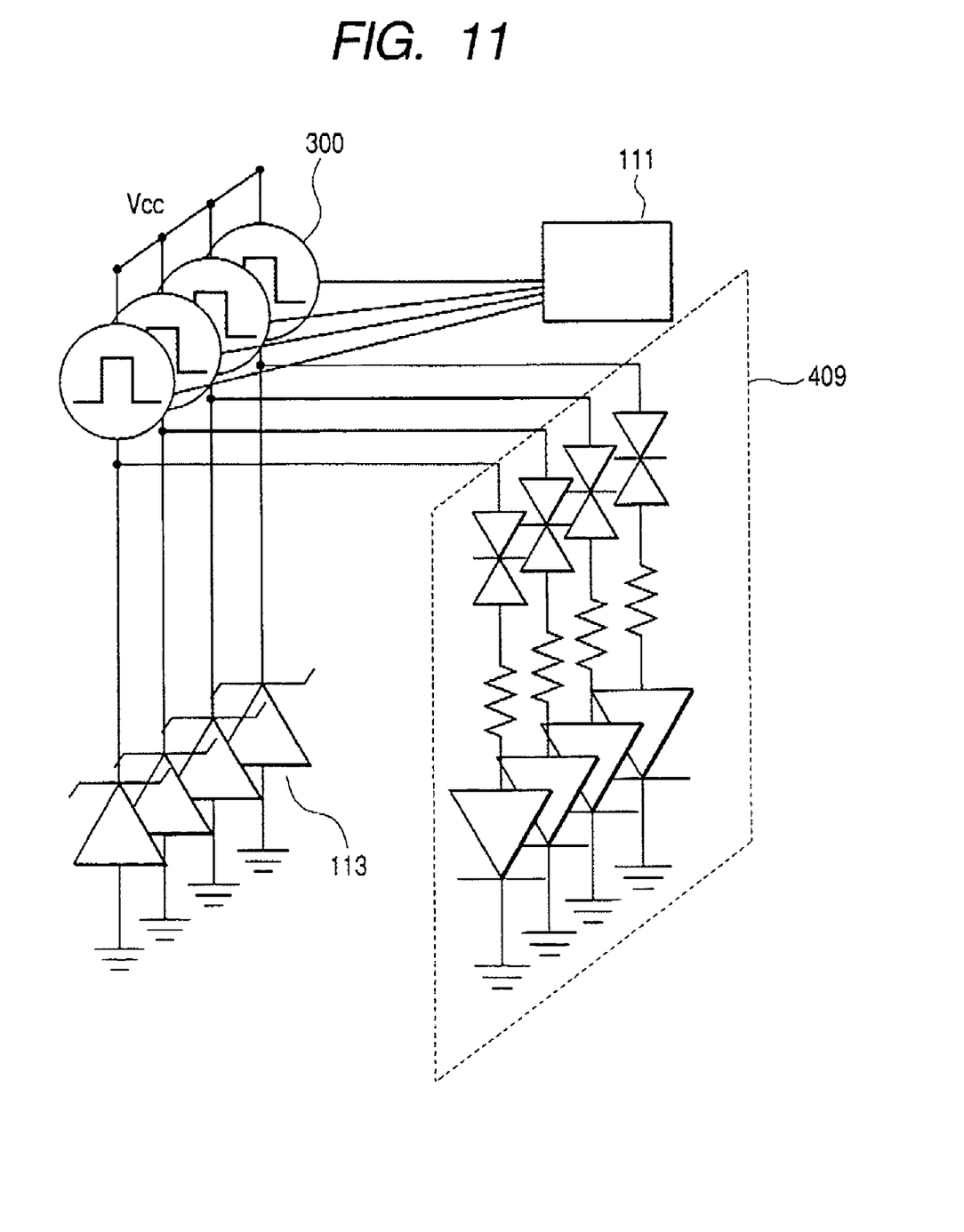
FIG. 11 is a diagram showing a laser driving unit of a fourth embodiment of the invention.

Hereinafter, a fourth embodiment of the invention will be described in accordance with the drawings. An exposure optical system of a laser printer to which the invention is applied is similar to that of the first embodiment except for that the laser printer is a high speed laser printer using a semiconductor laser array having a plurality of light emitting devices integrated on a chip. This unit is composed of four independent driving circuits as shown in FIG. 11 in order to drive four array elements, respectively. Each of the circuits includes a constant current pulsed source 300, a Zener diode 113, and a semiconductor laser 401. The constant current pulsed source 300 provides a constant current which is responsive to a signal from a signal processing unit 111 to the circuit using power supplied from 12 V power source. The Zener diode 113 maintains an input signal from the constant current pulsed source 300 at a predetermined voltage. The semiconductor laser array 401 is illustrated as three elements of an ideal diode 117, a series resistance 118, and a tunnel diode 302 having a negative resistance in FIG. 11. The Zener diode 113 operates to maintain a voltage at an input terminal of the semiconductor laser 401 at 4.5 V when the signal is on.

Figure 12:
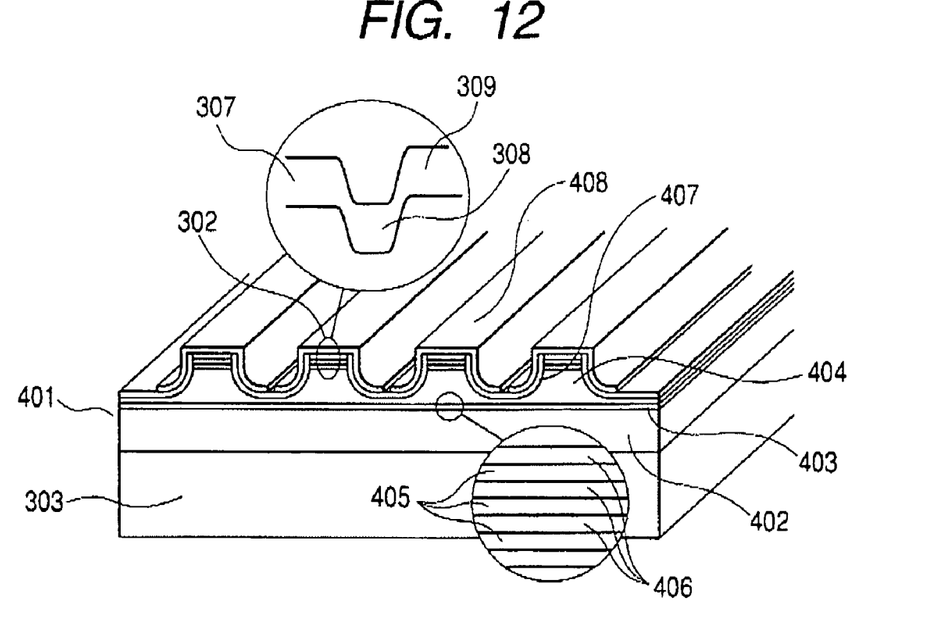
FIG. 12 is a diagram showing a structure of a semiconductor laser of the fourth embodiment of the invention.
Figure 13:
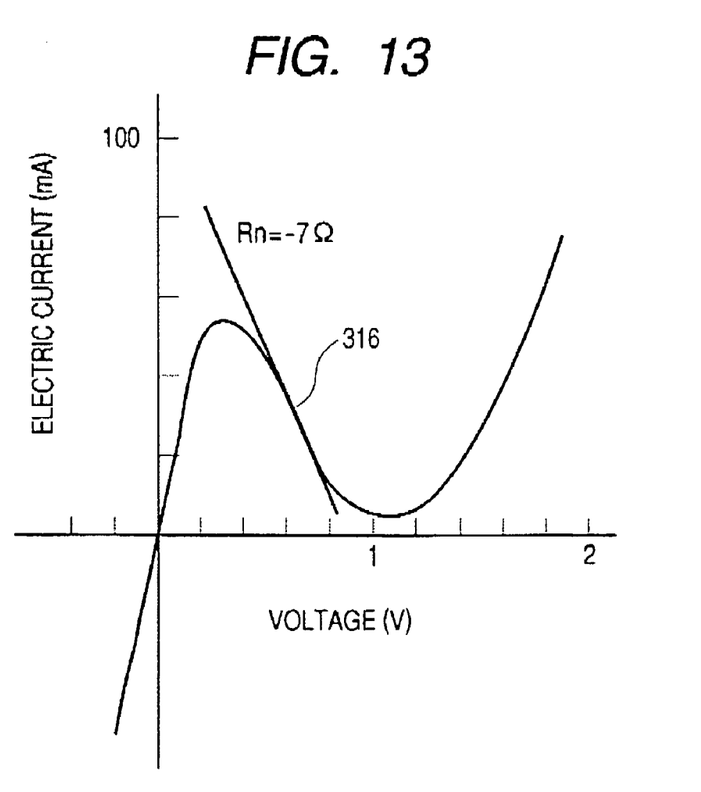
FIG. 13 is a diagram showing current/voltage characteristics of a tunnel diode of the semiconductor laser according to the fourth embodiment of the invention.

The semiconductor laser 401 of this embodiment is an AlGaAs device having a wavelength of 780 nm as shown in FIG. 12. This device comprises an n-type clad layer 402 (Se doped, p=7×10^{17} cm^{−3}, 1.8 μm) made of $(Al_{0.5}Ga_{0.5})As$, a multi quantum well active layer 403, a p-type clad layer 404 (Zn doped, n=1×10^{18} cm^{−3}, 1.8 μm) made of $(Al_{0.5}Ga_{0.5})As$, a p-type GaAs layer 307 (Zn doped, n=1×10^{20} cm^{−3}, 200 nm), an n-type GaAs layer 308 (Si doped, n=1×10^{20} cm^{−3}, 200 nm), and a p-type GaAs layer 309 (Zn doped, n=3×10^{19} cm^{−3}, 20 nm), which are formed on an n-type GaAs substrate 303 sequentially. The multi quantum well active layer is composed of three $Al_{0.1}Ga_{0.9}As$ well layers 405 (thickness: 7 nm) and four $Al_{0.5}Ga_{0.5}As$ barrier layers 406 (thickness: 4 nm) alternately sandwiching the $Al_{0.1}Ga_{0.9}As$ well layers 405 therebetween. From the p-type GaAs layer 309 to the p-type clad layer 403 made of $(Al_{0.5}Ga_{0.5})As$ are chemically removed so that the thickness thereof is reduced to about 0.3 μm except a stripe region 312 having a stripe width of 4 μm. In order to protect a surface having the above-described structure, a silicon oxide film 407 is deposited on the surface, and a portion of the silicon oxide film 407 on a ridge is removed to provide an electrode 408 mainly comprising gold, thereby achieving the semiconductor laser structure. In this embodiment, such four stripe regions are provided at 10-micron intervals. The p-type GaAs layer 307, the n-type GaAs layer 308, and the p-type GaAs layer 309 constitute a tunnel diode 302 of which current/voltage characteristics are as shown in FIG. 13. Operation of the tunnel diode is as described below. A large tunnel current flows through a junction of the p-type GaAs layer 307 with the n-type GaAs layer 308 because both of the layers are doped with impurity at a concentration of as high as $1\times10^{20}$ cm$^{-3}$, and a voltage drop scarcely occurs at the junction. Since an impurity concentration of the p-type GaAs layer 309 is as relatively low as $3\times10^{19}$ cm$^{-3}$, a junction of the n-type GaAs layer 308 with the p-type GaAs layer 309 does not help to constitute a perfect tunnel diode. Instead, an Esaki diode is constituted, that is, a tunnel current flows through the junction in a low voltage region, but the tunnel current is reduced with an increase in voltage resulting in a temporary reduction, and a further increased voltage allows the an ordinary diode current to flow. As shown in FIG. 13, a negative resistance region 316 having a differential resistance of about −7 Ω appears in the current/voltage characteristics of the tunnel diode. The negative resistance characteristics of the region make it is possible to set a differential resistance of the device as a whole to 3 Ω. As is apparent from the characteristics of the 780 nm semiconductor laser shown in Table 1, it is possible to substantially compensate for a temperature fluctuation in light output of the semiconductor laser when the series resistance is 3 Ω.

Embodiment 5

Hereinafter, a fifth embodiment of the invention will be described in accordance with the drawings. An exposure optical system of a laser printer to which the invention is applied is similar to that of the first embodiment except for using a semiconductor laser array having a plurality of light emitting devices integrated on a chip. This unit is composed of four independent driving circuits as shown in FIG. 11 in order to driving four array elements respectively. Each of the circuits includes a constant current source 112, a Zener diode 113, and a semiconductor laser 501. The constant current source 112 provides a constant current which is responsive to a signal from a signal processing unit 111 to the circuit using power supplied from 12 V power source. The Zener diode 113 maintains an input signal from the constant current source 112 at a predetermined voltage. The semiconductor laser is illustrated as three elements of an ideal diode 117, a series resistor 118, and a tunnel diode 302 having a negative resistance in FIG. 11. The Zener diode 113 operates to maintain a voltage at an input terminal of the semiconductor laser 501 at 6 V when the signal is on.

Figure 14:
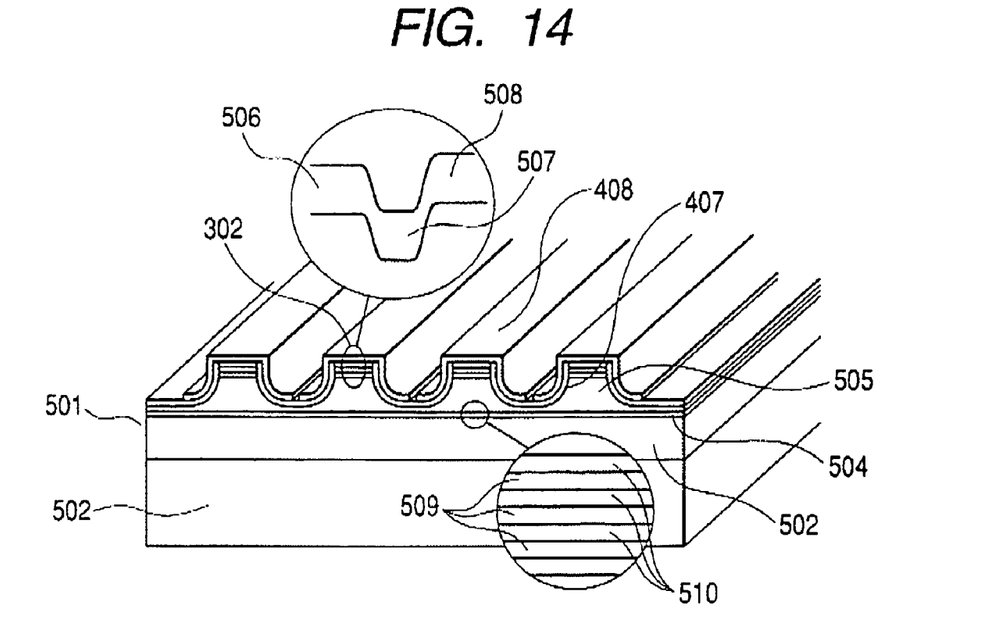
FIG. 14 is a diagram showing a structure of a semiconductor laser of a fifth embodiment of the invention.
Figure 15:
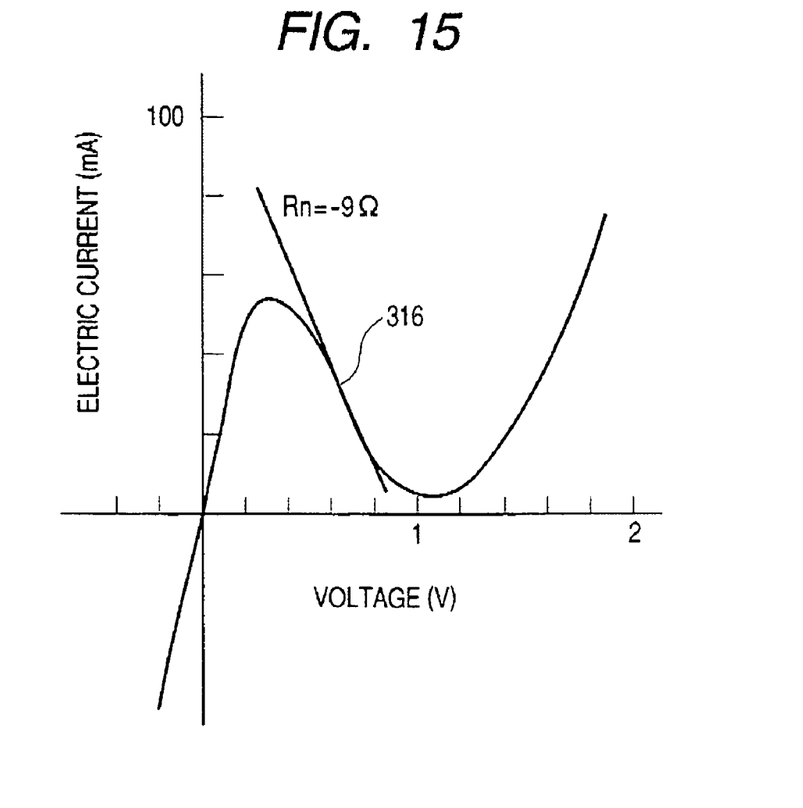
FIG. 15 is a diagram showing current/voltage characteristics of a tunnel diode of the semiconductor laser according to the fifth embodiment of the invention.

The semiconductor laser 501 of this embodiment is an AlGaN device having a wavelength of 405 nm as shown in FIG. 14. This device comprises an n-type clad layer 503 (Si doped, p=$7\times10^{17}$ cm$^{-3}$, 1.8 µm) made of $(Al_{0.2}Ga_{0.8})N$, a multi quantum well active layer 504, a p-type clad layer 505 (Mg doped, n=$1\times10^{18}$ cm$^{-3}$, 1.8 µm) made of $(Al_{0.2}Ga_{0.8})N$, a p-type GaN$_{0.99}$As$_{0.01}$ layer 506 (Mg doped, n=$1\times10^{20}$ cm$^{-3}$, 200 nm), an n-type GaN$_{0.99}$As$_{0.01}$ layer 507 (Si doped, n=$1\times10^{20}$ cm$^{-3}$, 200 nm), and a p-type GaN$_{0.99}$As$_{0.01}$ layer 508 (Mg doped, n=$3\times10^{19}$ cm$^{-3}$, 20 nm), which are formed on an n-type GaN substrate 502 sequentially. The multi quantum well active layer is composed of three In$_{0.1}$Ga$_{0.9}$N well layers 509 (thickness: 7 nm) and four Al$_{0.2}$Ga$_{0.8}$N barrier layers 510 (thickness: 4 nm) alternately sandwiching the Al$_{0.1}$Ga$_{0.9}$As well layers 509 therebetween. The layers from the p-type GaN$_{0.99}$As$_{0.01}$ layer 508 to the p-type clad layer 505 made of $(Al_{0.2}Ga_{0.8})N$ are removed by reactive ion etching so that the thickness thereof is reduced to about 0.3 µm except a stripe region 312 having a stripe width of 2.5 µm. In this embodiment, the stripe regions are provided at 10-micron intervals. The p-type GaN$_{0.99}$As$_{0.01}$ layer 506, the n-type GaN$_{0.99}$As$_{0.01}$ layer 507, and the p-type GaN$_{0.99}$As$_{0.01}$ layer 508 constitute a tunnel diode 302 of which current/voltage characteristics are as shown in FIG. 15. Operation of the tunnel diode is as described below. A large tunnel current flows through a junction of the p-type GaN$_{0.99}$As$_{0.01}$ layer 506 with the n-type GaN$_{0.99}$As$_{0.01}$ layer 507 because both of the layers are doped with impurity at a concentration of as high as $1\times10^{20}$ cm$^{-3}$, and a voltage drop scarcely occurs at the junction. Since an impurity concentration of the p type GaN$_{0.99}$As$_{0.01}$ layer 508 is as relatively low as $3\times10^{19}$ cm$^{-3}$, a junction of the n type GaN$_{0.99}$As$_{0.01}$ layer 507 with the p type GaN$_{0.99}$As$_{0.01}$ layer 508 does not help to constitute a complete tunnel diode. Instead, an Esaki diode is constituted, that is, a tunnel current flows through the junction in a low voltage region, but the tunnel current is reduced with an increase in voltage resulting in a temporary reduction, and a further increased voltage allows the an ordinary diode current to flow. As shown in FIG. 15, a negative resistance region 316 having a differential resistance of about −9 Ω appears in the current/voltage characteristics of the tunnel diode. The negative resistance characteristics of the region make it possible to set a differential resistance of the device as a whole to 1 Ω. As is apparent from the characteristics of the 405 nm semiconductor laser shown in Table 1, it is possible to substantially compensate for a temperature fluctuation in light output of the semiconductor laser when the series resistance is 1 Ω.

With the present invention, it is possible to largely suppress the droop characteristics, which frequently present problems with application of a semiconductor laser to a printer, with the use of a relatively simple circuit structure; therefore, the invention has remarkably great industrial applicability.

Denotations of reference numerals used in the drawings are as follows:

1: threshold current, 2: light output/current characteristics (temperature T), 3: light output/current characteristics (temperature T+ΔT), 4: initial output, 5: output with raised temperature, 6: waveform of pulsed current, 7: waveform of light pulse, 8: driving current of device emitting light, 9: driving current of adjacent device, 10: light output of device emitting light, 11: current/voltage characteristics (temperature T), 12: current/voltage characteristics (temperature T+ΔT), 13: initial driving current, 14: driving current after temperature rise, 15: light output at constant voltage driving, 101: semiconductor laser, 102: laser beams, 103: collimator lens, 104: condenser lens, 105: rotating polygonal mirror, 106: non-spherical lens system, 107: photoconductor, 108: drum, 109: laser driving unit, 110: image information, 111: signal processing unit, 112: constant current source, 113: Zener diode, 114: first transistor, 115: second transistor, 116: negative resistance circuit, 117: ideal diode, 118: series resistance, 201: field effect transistor, 301: semiconductor laser, 302: tunnel diode, 303: n-type GaAs substrate, 304: n-type clad layer made of $(Al_{0.7}Ga_{0.3})_{0.5}In_{0.5}P$, 305: multi quantum well active layer, 306: p type clad layer made from $(Al_{0.7}Ga_{0.3})_{0.5}In_{0.5}P$, 307: p type GaAs layer, 308: n type GaAs layer, 309: p type GaAs layer, 310: Ga$_{0.5}$In$_{0.5}$P well layer, 311: $(Al_{0.5}Ga_{0.5})_{0.5}In_{0.5}P$ barrier layer, 312; stripe region, 313: n-GaAs current blocking layer, 314: p-GaAs contact layer, 315: gold electrode, 316: negative resistance region, 400: constant current source, 401: semiconductor laser, 402: n-type clad layer made of $(Al_{0.5}Ga_{0.5})As$, 403: multi quantum well active layer, 404: p type clad layer made of $(Al_{0.5}Ga_{0.5})As$, 405: Al$_{0.5}$Ga$_{0.9}$As well layer, 406; Al$_{0.5}$Ga$_{0.5}$As barrier layer, 407: silicon oxide layer, 408: gold electrode, 409: semiconductor laser array, 501: semiconductor laser, 502: n-type GaN substrate, 503: clad layer made of $(Al_{0.2}Ga_{0.9})N$, 504: multi quantum well active layer, 505: p-type clad layer, 506: p-type GaN layer, 507: n-type GaN layer, 508; p-type GaN layer, 509: well layer made of $Al_{0.1}Ga_{0.9}N$, 510: barrier layer made of $Al_{0.5}Ga_{0.5}N$, 511: p-type GaN layer, 512: p-type clad layer made of $(Al_{0.2}Ga_{0.8})N$.

What is claimed is:

1. A driving system for a semiconductor laser device comprising:

a semiconductor laser device for emitting light by energization; and a compensation circuit, connected to the semiconductor laser device in series, for compensating for an amount of current flowing through the semiconductor laser device; wherein the compensation circuit automatically compensates for a fluctuation in light output caused by a fluctuation in current vs. light output characteristics of the semiconductor laser device occurring due to a temperature change in a light emitting portion of the semiconductor laser device by use of a change in voltage vs. current characteristics of the semiconductor laser device occurring due to the temperature change in the light emitting unit of the semiconductor laser device, wherein the compensation circuit includes a negative resistance circuit comprising:

first MOSFET device having a gate electrode connected to an input terminal and a substrate bias electrode connected to an output terminal;

a second MOSFET device having a source electrode connected to the input terminal and a drain electrode connected to the output terminal, the drain electrode of the first MOSFET element being connected to the gate electrode of the second MOSFET device; and a resistance device having terminals, one of which is connected to the gate electrode of the second MOSFET and the other of which is connected to a power source voltage.

2. The driving system for a semiconductor laser device according to claim 1, wherein the compensation circuit includes:

a first transistor provided between an input terminal and an output terminal thereof; and a second transistor for changing a voltage or a current to be input to the first transistor in such a manner as to reduce a current flowing between the the input terminal and the output terminal of the first transistor when a voltage applied to the compensation circuit is increased.

3. The driving system for a semiconductor laser device according to claim 1, comprising:

a MOSFET device having terminals, one of which is connected to the light emitting device and the other of which is maintained at a predetermined voltage;

wherein a voltage reverse to a voltage corresponding to image information is input to a gate electrode of the MOSFET device.

4. The driving system for a semiconductor laser device according to claim 1, wherein a negative resistance device is connected in series to an external terminal of the light emitting device.

5. The driving system for a semiconductor laser device according to claim 1, wherein the light emitting device is formed on a semiconductor substrate, and a negative resistance device connected in series to the light emitting device is formed on the semiconductor substrate.

* * * * *